(12) United States Patent
Hausmann

(10) Patent No.: US 6,876,586 B1
(45) Date of Patent: Apr. 5, 2005

(54) SHIFT REGISTER CHAIN FOR TRIMMING GENERATORS FOR AN INTEGRATED SEMICONDUCTOR APPARATUS

(75) Inventor: Michael Hausmann, Unterhaching (DE)

(73) Assignee: Infineon Technologies AG, Munich (DE)

( * ) Notice: Subject to any disclaimer, the term of this patent is extended or adjusted under 35 U.S.C. 154(b) by 57 days.

(21) Appl. No.: 10/645,053

(22) Filed: Aug. 21, 2003

(30) Foreign Application Priority Data

Aug. 21, 2002 (DE) .......................................... 102 38 279

(51) Int. Cl.[7] ................................................. G11C 7/00
(52) U.S. Cl. ............................. 365/189.12; 365/189.09; 365/225.7
(58) Field of Search ............................. 365/154, 189.02, 365/189.12, 220, 221, 225.7, 189.09

(56) References Cited

U.S. PATENT DOCUMENTS 6,118,710 A * 9/2000 Tsuji ........................... 365/200
6,459,649 B2 * 10/2002 Krause et al. ............ 365/230.08
6,819,596 B2 * 11/2004 Ikehashi et al. .......... 365/185.22

* cited by examiner

*Primary Examiner*—Michael S. Lebentritt
*Assistant Examiner*—Hien Nguyen
(74) *Attorney, Agent, or Firm*—Fish & Richardson P.C.

(57) ABSTRACT

An integrated semiconductor apparatus includes at least one fuse box device that includes fuses for storing trimming data, a fuse box trimming output, and a timer emitting a clock signal. The apparatus also includes a parallel/serial converter that is connected to the fuses and to the timer. The parallel/serial converter is configured to read, in parallel, the trimming data from the fuses and to emit, in serial, the trimming data from the fuse block trimming output based on the clock signal. The apparatus also includes generators. Each generator generates a generator signal and includes a trimming unit that has a trimming signal input. The trimming unit is configured to trim the generator signal of the generator based on the trimming data received. The generator also includes a trimming signal output and memory flip-flops that connect the trimming input signal to the trimming output signal. Each of the memory flip-flops connects each trimming unit to the fuse block trimming output to form a shift register chain for serial transmission of the trimming data from the fuse block device to the generators.

20 Claims, 1 Drawing Sheet

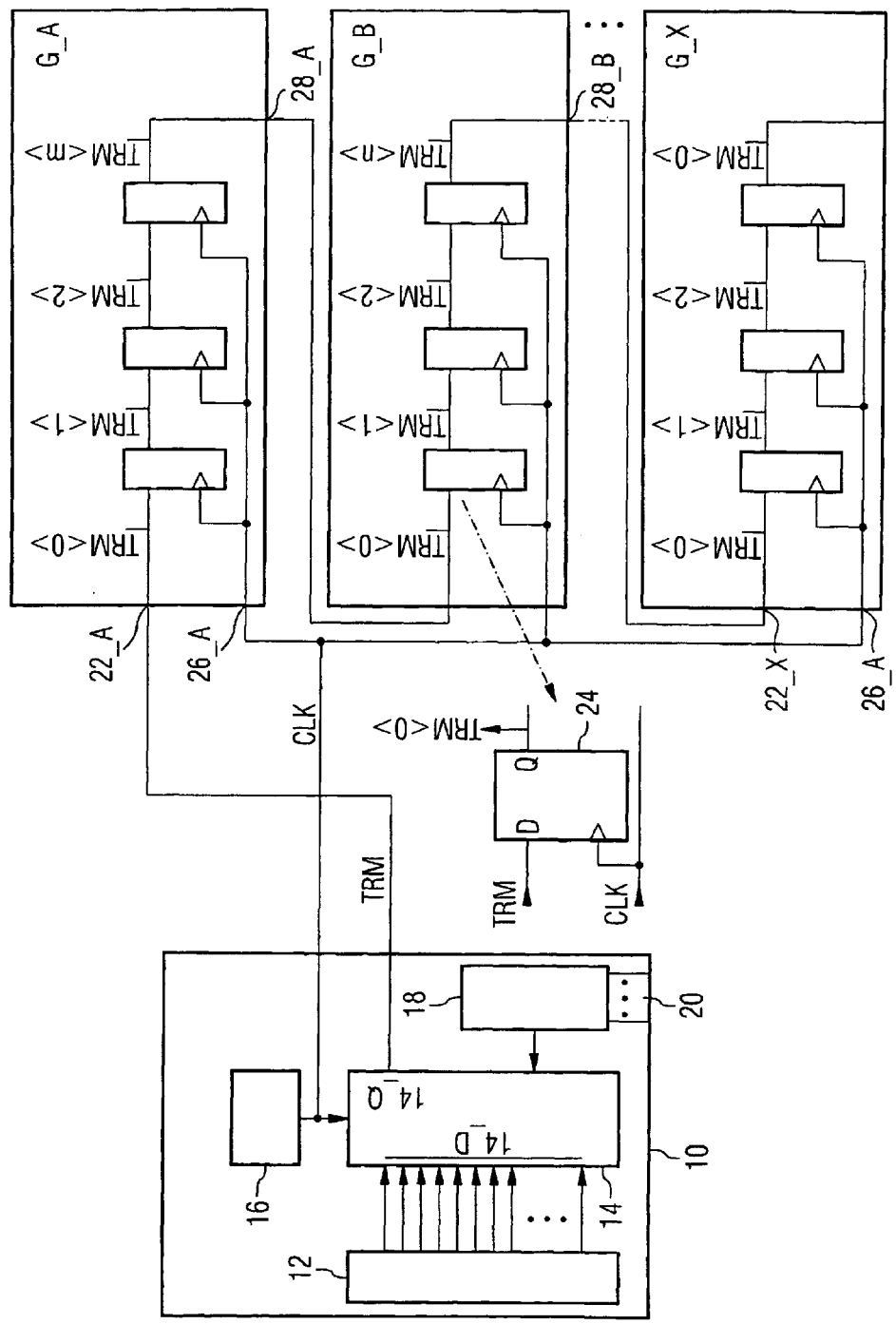

US 6,876,586 B1

SHIFT REGISTER CHAIN FOR TRIMMING GENERATORS FOR AN INTEGRATED SEMICONDUCTOR APPARATUS

FIELD OF INVENTION

The present invention relates to an integrated semiconductor apparatus having trimmable generators.

PRIORITY OF OTHER APPLICATIONS

This application claims priority from German Patent Application No. 102 38 279.4-53, filed Aug. 21, 2002, and entitled SHIFT REGISTER CHAIN FOR TRIMMING GENERATORS FOR AN INTEGRATED SEMICONDUCTOR APPARATUS.

BACKGROUND

Integrated semiconductor apparatuses typically have a large number of generators, which are integrated on-chip (on the chip). Generators such as these may, for example, be designed to produce an internal supply voltage, which is used internally in the chip, that is to say in the integrated semiconductor apparatus. Particularly in the case of semiconductor memories, for example DRAMs, on-chip voltages which are required in the memory are produced by voltage generators. Since the requirements which are placed on the production of such internal voltage supplies to the generators (minimum discrepancies between the emitted actual voltage and a desired nominal voltage) are becoming continuously more stringent, generator signals such as these must be "trimmed". During the trimming process, the generator signal, that is to say the output signal from a generator, is matched by means of trimming data as closely as possible to a desired reference signal or nominal signal. Trimming is particularly necessary since the components from which such generators are constructed are subject to parameter fluctuations which are caused by process fluctuations during the production process (for example the CMOS process).

Thus, the generators which must be trimmed must be measured, even at what is referred to as the wafer level, in order to define the trimming data that is required for trimming. The defined trimming data is then stored in a nonvolatile memory, which is accommodated in a fuse block device. The fuse block device contains a large number of nonvolatile, programmable fuses, in which the trimming data can be stored in a nonvolatile form. In order to transmit the trimming data from the fuse block device to the generators, which may be distributed at different locations in the chip, lines must be provided, some of which must be wired transversely through the chip. Modern DRAM memories have a large number of trimming signals which pass transversely through the chip and which contribute to the overall chip width.

SUMMARY

Against the background of the above disadvantages, one object of the invention is to specify an integrated semiconductor apparatus having trimmable generators, in which the transmission of the trimming signals does not significantly complicate the chip layout.

According to the invention, an integrated semiconductor apparatus comprises:

a large number of generators for producing predetermined generator signals, with each of the generators having a trimming unit with a trimming signal input for receiving digital trimming data, and the trimming unit being designed for trimming the generator signals that are produced, as a function of the trimming data;

at least one fuse block device having a large number of fuses which are designed for nonvolatile storage of the trimming data for trimming the large number of generators, a parallel/serial converter which is connected to the fuses and to a timer for signaling purposes and is designed to read the trimming data from the fuses in parallel and to emit it in serial form via a fuse block trimming output to the fuse block device in time with the timer;

in which each of the generators has a trimming signal output and a large number of memory flipflops which connect the trimming signal input of the generator to its trimming signal output, and the memory flipflops of the trimming units are connected to the fuse block trimming output in the form of a shift register chain for serial transmission of the trimming data from the fuse block device to the generators.

Thus, according to the invention, a shift register chain is used for serial transmission of the trimming data from the fuse block device to the individual generators. There is therefore no need to route a large number of trimming lines in parallel transversely through the chip. Only a single trimming data line is preferably provided, which passes through the large number of generators in the form of a chain from the fuse block trimming output. For this purpose, the trimming units of the generators have memory flipflops, which are arranged between a trimming signal input and a trimming signal output of the trimming units. The trimming data which is stored in the fuses of the fuse block device is read by the parallel/serial converter, and is emitted as a serial data stream in time with the timer, via the fuse block trimming output. After a predetermined number of shift cycles in the shift register chain, the correct trimming data is available for the trimming units of the individual generators, so that the generator signals can be trimmed correctly.

The generator signals are preferably signals which are produced and required on-chip, and are emitted from the generator via a generator output. The expression trimming of these signals means matching of the (untrimmed) actual voltage to a desired (trimmed) nominal voltage. The final generator which is provided at the end of the shift register chain does not necessarily need to have a trimming signal output, since it need not be connected to any further generator.

The trimming signal output is preferably connected from one of the generators to the fuse block trimming output, and the trimming signal inputs of the other generators are each connected in the form of a chain to one, and only one, of the trimming signal outputs. Each trimming unit preferably has one, and only one, trimming signal input. A trimming signal input of one of the generators is connected to the fuse block trimming output. The trimming signal output of this generator is connected to a downstream trimming signal input of the next generator, so that the generators are connected to the fuse block device in the form of a chain.

The generators are preferably voltage generators and the generator signals are preferably output voltages, with the trimming units being designed for trimming the output voltage as a function of the trimming data. The generators may, for example, be what are referred to as charge pumps, which produce supply voltages required in the chip by "pumping" of externally applied voltages. Voltage generators such as these emit as the generator signals output voltages which have to satisfy stringent specifications. During the process of trimming such output voltages, digital (binary) trimming data is supplied to the trimming units of such voltage generators, which can associate the binary trimming data with a predetermined voltage correction, for example by means of a table stored in the trimming units.

Alternatively, the generators are delay generators and the generator signals are signals which are delayed in time with respect to a reference signal, with the trimming units being designed for trimming the time delay of the time-delayed signal as a function of the trimming data. For example, the reference signal may be a clock signal, and the time-delayed signal may be a generator signal, which is delayed in time in a specific manner with respect to this clock signal. The magnitude or the duration of the time delay of the time-delayed signal with respect to the reference signal likewise has to satisfy stringent specifications for numerous applications, so that it must be trimmed by means of a trimming unit. The magnitude of the time delay can be adjusted via binary trimming data, which is supplied to the trimming unit, by means of a table which is stored in the trimming unit. For this purpose, the reference signal is fed into the generator.

The fuse block device preferably has a fuse block clock output for emitting the clock of the timer, and the fuse block clock output is connected to clock inputs of the generators for signaling purposes. This allows a shift register to be configured in a particularly simple manner, using time-division multiplexing. The clock with which the individual binary trimming data is in each case shifted further through one memory flipflop in the shift register chain is in this embodiment supplied to the trimming units through a separate clock line.

As an alternative to the separate transfer of the clock signal from the fuse block device to the generators as just described, the parallel/serial converter can be designed to emit the trimming data in pulse-width modulated form. The serial data stream which is emitted from the parallel/serial converter via the fuse block trimming output is thus pulse-width modulated (pulse-duration modulated). In the case of pulse-duration modulation, the binary data to be transmitted is coded by the duty ratio of the time periods between a high voltage value and a low voltage value, with a constant pulse repetition frequency. The clock signal can thus be derived in a known manner from the pulse-duration modulated signal, so that it need not be separately transmitted to the trimming units. This allows a further reduction in the wiring complexity between the fuse block device and the individual generators, since only a single trimming line (data line) advantageously need be provided for transmission of the trimming signals.

The fuses in the fuse block device are preferably electrically or laser-programmable.

The integrated semiconductor apparatus is preferably an integrated semiconductor memory, in particular a DRAM memory.

The invention can also equally be used for integrated logic circuits, for example for processors.

BRIEF DESCRIPTION OF THE DRAWINGS

The invention will be described by way of example in the following text with reference to an accompanying drawing of one preferred embodiment, in which:

FIG. 1 shows a schematic block diagram of one preferred embodiment of an integrated semiconductor apparatus having a shift register chain for generator trimming.

DETAILED DESCRIPTION

FIG. 1 shows a highly simplified block diagram of a fuse block device 10 as well as generators G_A, G_B, G_X. The fuse block device 10 has a large number of fuses 12, which are indicated in the form of a fuse box in FIG. 1. The large number of fuses 12 are connected in parallel to a parallel input 14_D of a parallel/serial converter 14. The parallel/serial converter 14 receives a clock signal CLK from a timer 16, which is likewise arranged in the fuse block device 10. The parallel/serial converter 14 is driven by a control device 18, which has control inputs 20 which signal, for example, the start and end of a trimming cycle. The parallel/serial converter 14 loads the trimming data (which is stored in the fuses 12) via its input 14_D, and converts this trimming data to a serial binary trimming data stream at the clock rate CLK of the timer 16. The serial trimming data signal TRM is emitted from the fuse block device 10 via the fuse block trimming output 14_Q.

The generators G_A, G_B, . . . , G_X are connected to the fuse block trimming output 14_Q in the form of a shift register chain. A shift register is a chain of memory flipflops, which make it possible to shift information which is applied to the input onward by one memory flipflop with each clock cycle. After passing through the chain, the information is produced at the output with a delay, but otherwise unchanged. In this context, reference is made to the description of shift registers in "Halbleiter-Schaltungstechnik" [Semiconductor circuit technology] by U. Titze and Ch. Schenk, 12th edition, Springer-Verlag, Chapter 9.5, whose explanatory notes relating to shift registers are an integral component of the present application. The fuse block trimming output 14_Q is connected via a single trimming line to a trimming signal input 22_A of the generator G_A. Within the generator G_A there is a trimming unit which is not illustrated in any more detail but which has an m bits shift register with the trimming signals TRM<0>, TRM<1>, . . . , TRM<m>. The m bits shift register of the generator G_A (and of the other generators) is illustrated enlarged, in a partial view, in the inset in FIG. 1.

The serial trimming signal TRM is applied to an input connection D of a memory flipflop 24. Furthermore, the clock CLK from the timer 16 is supplied to the memory flipflop 24 externally via a clock input 26_A of the generator G_A. The generator G_A also has a trimming signal output 28_A, which is connected to the trimming signal input 22_B of the generator G_B. The shift register chain which is provided in the generator G_B has n bits. The trimming output 28_B of the generator G_B is connected to the trimming signal input 22_X of the next generator (which is not illustrated in any more detail). In this way, the shift register chain is continued as far as the generator G_X, which forms the last generator in the shift register chain and does not necessarily need to have a trimming signal output 28_X.

During operation, the binary serial trimming signal TRM is shifted, clocked in time with the clock CLK of the timer 16, by the memory flipflops 24 through all the generators G_A, G_B, . . . , G_X. After a number of clock cycles which corresponds to the total number of memory flipflops 24 for all the generators, the first emitted trimming signal bit is produced at the final data output TRM<0> of the last generator G_X, so that all the trimming signals have been transmitted to the trimming units correctly.

Since the transmission rate or the clock CLK is typically several tens of MHz, but the time constants for changes to the generator signals are several microseconds, the generators cannot follow the process during the single transmission of the trimming data when the chip is being started up. Correctly trimmed generator signals are not produced until the trimming data has been successfully transmitted.

While in the case of conventional trimming concepts, 40 to 50 trimming signals typically have to be routed transversely through the chip (each trimming unit typically has 3 to 6 binary inputs and there are typically 10 generators in each memory chip), the generator trimming by means of the shift register chain allows a considerable simplification to the design.

What is claimed is:

1. An integrated semiconductor apparatus comprising:
   at least one fuse box device comprising fuses for storing trimming data, a fuse box trimming output, and a timer emitting a clock signal;
   a parallel/serial converter connected to the fuses and to the timer; the parallel/serial converter being configured to read, in parallel, the trimming data from the fuses and to emit, in serial, the trimming data from the fuse block trimming output based on the clock signal;
   generators, each generator generating a generator signal, each generator comprises:
      a trimming unit having a trimming signal input, the trimming unit being configured to trim the generator signal of the generator based on the trimming data received;
      a trimming signal output;
      memory flip-flops connecting the trimming input signal to the trimming output signal; and
   wherein each of the memory flip-flops connects each trimming unit to the fuse block trimming output to form a shift register chain for serial transmission of the trimming data from the at least one fuse block device to the generators.

2. The apparatus of claim 1, wherein the trimming signal input is connected from one of the generators to the fuse block trimming output; and
   wherein the trimming signal inputs of the other generators are each connected in a chain to one of the trimming signal outputs.

3. The apparatus of claim 1, wherein each generator is a voltage generator and the generator signal is an output voltage, and wherein the trimming unit trims the output voltage based on the trimming data.

4. The apparatus of claim 1, wherein the generator is a delay generator and wherein the generator signal is a time-delayed signal, and wherein the trimming unit trims the time delay of the time-delayed signal based on the trimming data.

5. The apparatus of claim 1, wherein each generator further comprises a clock input; and wherein the fuse block device further comprises a fuse block clock output for emitting the clock signal from the timer to the clock input of each generator.

6. The apparatus of claim 1, wherein the parallel/serial converter emits pulse-width modulated trimming data.

7. The apparatus of claim 1, wherein the fuses are electrically-programmable.

8. The apparatus of claim 1, wherein the fuses are laser-programmable.

9. The apparatus of claim 1, wherein the integrated semiconductor apparatus comprises an integrated semiconductor memory.

10. The apparatus of claim 1, wherein the integrated semiconductor apparatus comprises an integrated logic circuit.

11. A method of trimming generator signals generated from generators, comprising:
    reading, in parallel, stored trimming data for generators;
    connecting to each generator to form a shift register chain for serial transmission of the trimming data to the generators;
    emitting, in serial, the trimming data based on a clock signal; and
    trimming each generator signal based on the trimming data received.

12. The method of claim 11, wherein each generator comprises a trimming signal input and a trimming signal output, and further comprising;
    connecting trimming data to the trimming data input of one of the generators; and
    connecting, in a chain, the trimming signal inputs of the other generators to one of the trimming signal outputs.

13. The method of claim 11, wherein each generator is a voltage generator and the generator signal is an output voltage, and wherein timing the generator signal comprises trimming the output voltage based on the trimming data.

14. The method of claim 11, wherein the generator is a delay generator and wherein the generator signal is a time-delayed signal, and wherein trimming the generator signal comprises trimming the time delay of the time-delayed signal based on the trimming data.

15. The method of claim 11, further comprising sending the clock signal to each generator.

16. The method of claim 11, wherein emitting comprises emitting pulse-width modulated trimming data.

17. The method of claim 11, wherein the fuses are electrically-programmable.

18. The method of claim 11, wherein the fuses are laser-programmable.

19. The method of claim 11, wherein the integrated semiconductor apparatus comprises an integrated semiconductor memory.

20. The method of claim 11, wherein the integrated semiconductor apparatus comprises an integrated logic circuit.

* * * * *